(12) United States Patent
Hashizume et al.

(10) Patent No.: US 10,868,168 B2
(45) Date of Patent: Dec. 15, 2020

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Yuichi Hashizume, Matsumoto (JP); Keishirou Kumada, Matsumoto (JP); Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 25 days.

(21) Appl. No.: 16/233,784

(22) Filed: Dec. 27, 2018

(65) Prior Publication Data

US 2019/0131444 A1 May 2, 2019

Related U.S. Application Data

(63) Continuation of application No. PCT/JP2017/042928, filed on Nov. 29, 2017.

(30) Foreign Application Priority Data

Jan. 17, 2017 (JP) .................................. 2017-005668

(51) Int. Cl.
*H01L 29/78* (2006.01)
*H01L 29/66* (2006.01)
(Continued)

(52) U.S. Cl.
CPC .......... *H01L 29/7804* (2013.01); *H01L 21/28* (2013.01); *H01L 29/1095* (2013.01);
(Continued)

(58) Field of Classification Search
None
See application file for complete search history.

(56) References Cited

U.S. PATENT DOCUMENTS

2011/0140180 A1* 6/2011 Kitagawa .............. H01L 29/205
257/280
2011/0291110 A1* 12/2011 Suzuki ................ H01L 29/0878
257/77
(Continued)

FOREIGN PATENT DOCUMENTS

JP 2011-82454 A 4/2011
JP 2011-199141 A 10/2011
(Continued)

OTHER PUBLICATIONS

Japanese Office Action dated Jan. 21, 2020 in corresponding Japanese Patent Application No. 2018-562917.
(Continued)

*Primary Examiner* — Reema Patel
*Assistant Examiner* — Steven M Christopher

(57) ABSTRACT

A semiconductor device includes a semiconductor substrate, a first semiconductor layer of a first conductivity type, a second semiconductor layer of a second conductivity type, a third semiconductor layer of the second conductivity type, a first semiconductor region of the first conductivity type, a second semiconductor region of the first conductivity type, a gate insulating film, and a gate electrode. A threshold voltage of the semiconductor device is higher than forward voltage of a built-in PN diode constituted by the second semiconductor layer, the semiconductor substrate, and the first semiconductor layer. Thus, when high electric potential is applied to a source electrode and the built-in PN diode is driven, the generation of crystal effects may be suppressed.

7 Claims, 4 Drawing Sheets

(51) Int. Cl.
  *H01L 29/16* (2006.01)
  *H01L 29/49* (2006.01)
  *H01L 21/28* (2006.01)
  *H01L 29/10* (2006.01)
  *H01L 29/739* (2006.01)
  *H01L 29/06* (2006.01)

(52) U.S. Cl.
  CPC ...... *H01L 29/1608* (2013.01); *H01L 29/4916* (2013.01); *H01L 29/66068* (2013.01); *H01L 29/78* (2013.01); *H01L 29/7802* (2013.01); *H01L 29/7813* (2013.01); *H01L 29/0623* (2013.01); *H01L 29/7397* (2013.01)

(56) References Cited

U.S. PATENT DOCUMENTS

| | | | |
|---|---|---|---|
| 2012/0012861 | A1 | 1/2012 | Nakano et al. |
| 2012/0057386 | A1 | 3/2012 | Adachi et al. |
| 2012/0286290 | A1 | 11/2012 | Uchida |
| 2014/0152374 | A1 | 6/2014 | Adachi et al. |
| 2016/0247910 | A1* | 8/2016 | Suzuki ............. H01L 29/0623 |
| 2016/0260829 | A1* | 9/2016 | Aichinger ........... H01L 29/7813 |
| 2016/0315186 | A1 | 10/2016 | Kinoshita et al. |
| 2017/0077087 | A1* | 3/2017 | Horikawa ........... H01L 29/7804 |

FOREIGN PATENT DOCUMENTS

| | | |
|---|---|---|
| JP | 2012-104856 A | 5/2012 |
| JP | 2013-254789 A | 12/2013 |
| JP | 2014-99444 A | 5/2014 |
| JP | 2015-72999 A | 4/2015 |
| JP | 2015-162578 A | 9/2015 |
| JP | 2016-25324 A | 2/2016 |
| JP | 2016-46288 A | 4/2016 |
| JP | 2016-181673 A | 10/2016 |
| WO | 2010/110246 A1 | 9/2010 |
| WO | 2012/056705 A1 | 5/2012 |
| WO | 2016/013471 A1 | 1/2016 |
| WO | 2016/181903 A1 | 11/2016 |

OTHER PUBLICATIONS

Baliga, B. Jayant, "Silicon Carbide Power Devices", World Scientific Publishing Co., Mar. 30, 2006, p. 61-69.

Shenai, K, et al, "Optimum Semiconductors for High-Power Electronics", IEEE Transactions on Electron Devices, vol. 36, No. 9, Sep. 1989, pp. 1811-1823. (Discussed in the Patent Application Specification).

International Search Report dated Jan. 9, 2018 in corresponding International Application No. PCT/JP2017/042928.

Written Opinion of the International Searching Authority dated Jan. 9, 2018 in corresponding International Application No. PCT/JP2017/042928.

* cited by examiner

US 10,868,168 B2

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2017/042928 filed on Nov. 29, 2017 which claims priority from a Japanese Patent Application No. 2017-005668 filed on Jan. 17, 2017, the contents of which are incorporated herein by reference.

BACKGROUND

1. Field

Embodiments discussed herein relate to a semiconductor device and a method of manufacturing a semiconductor device.

2. Description of Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics (for example, refer to K. Shenai, et al, "Optimum Semiconductors for High-Power Electronics", IEEE Transactions on Electron Devices, September 1989, Vol. 36, No. 9, pp. 1811-1823).

Silicon carbide is chemically a very stable material, has a wide bandgap of 3 eV, and can be used very stably as a semiconductor material even at high temperatures. Further, silicon carbide has a critical electric field strength that is ten times that of silicon or greater, and has a high possibility of exceeding the material limit of silicon. Therefore, future growth is strongly expected for power semiconductor applications, particularly vertical MOSFETs. Especially, vertical SiC-MOSFET is expected with low ON resistance and high breakdown voltage.

FIG. 7 is a cross-sectional view of a conventional vertical SiC-MOSFET. As depicted in FIG. 7, on a front surface of an n$^+$-type silicon carbide substrate 101, an n-type silicon carbide epitaxial layer 102 is deposited and at a surface of the n-type silicon carbide epitaxial layer 102, a p-type base layer 104 is selectively provided. Further, at a surface of the p-type base layer 104, an n$^+$-type source region 105 and a p$^+$-type contact region 106 are selectively provided.

At surfaces of the p-type base layer 104 and the n$^+$-type source region 105, a gate electrode 109 is provided via a gate insulating film 108. Further, a source electrode 1010 is provided on surfaces of the n-type silicon carbide epitaxial layer 102, the p$^+$-type contact region 106, and the n$^+$-type source region 105. Further, on a rear surface of the n$^+$-type silicon carbide substrate 101, a drain electrode 1011 is provided.

In the MOSFET of the structure depicted in FIG. 7, when voltage less than a gate threshold voltage Vth is applied to the gate electrode 109 in a state where with respect to the source electrode 1010, voltage that is positive is applied to the drain electrode 1011, a PN junction between a p$^+$-type base layer 103 and the n-type silicon carbide epitaxial layer 102, or a PN junction between the p-type base layer 104 and an n-type well region 107 is in a reversed bias state and therefore, current does not flow. Meanwhile, when voltage equal to or higher than the gate threshold voltage Vth is applied to the gate electrode 109, at a surface of the p-type base layer 104 or the p$^+$-type base layer 103 directly beneath the gate electrode 109, current flows due to the formation of an n-type inversion layer (channel), whereby switching operation of the MOSFET by the voltage applied to the gate electrode 109 is enabled. When the MOSFET is OFF, high electric potential is applied to the source electrode 1010, whereby a built-in PN (pin) diode constituted by the p$^+$-type base layer 103, the n$^+$-type silicon carbide substrate 101, and the n-type silicon carbide epitaxial layer 102 may be driven.

Further, according to one technique, a MIS transistor functions as a diode in which current flows in a reverse direction from the source electrode toward a drain electrode, via a second silicon carbide semiconductor layer. The absolute value of the turn-on voltage of this diode is made lower than the absolute value of the turn-on voltage of a body diode, whereby progression of crystal degradation of the SiC semiconductor device may be suppressed to thereby maintain high reliability (for example, refer to Japanese Laid-Open Patent Publication No. 2012-104856).

SUMMARY

According to an embodiment of the present invention, a semiconductor device includes a semiconductor substrate of a first conductivity type; a first semiconductor layer of the first conductivity type, provided on a front surface of the semiconductor substrate, the first semiconductor layer having an impurity concentration lower than that of the semiconductor substrate; a second semiconductor layer of a second conductivity type, selectively provided in a surface layer of the first semiconductor layer on a first side of the first semiconductor layer, opposite a second side of the first semiconductor layer facing toward the semiconductor substrate; a third semiconductor layer of the second conductivity type, provided on the surface layer of the first semiconductor layer and on a surface layer of the second semiconductor layer on a first side of the second semiconductor layer, opposite a second side of the second semiconductor layer facing toward the semiconductor substrate, the third semiconductor layer having an impurity concentration lower than that of the second semiconductor layer; a first semiconductor region of the first conductivity type, selectively provided in a surface layer of the third semiconductor layer on a first side of the third semiconductor layer, opposite a second side of the third semiconductor layer facing toward the semiconductor substrate; a second semiconductor region of the first conductivity type, penetrating the third semiconductor layer and reaching the first semiconductor layer; a gate electrode provided on at least a part of a surface of the third semiconductor layer sandwiched between the first semiconductor region and the second semiconductor region, the gate electrode provided via a gate insulating film; a first electrode provided on a surface of the first semiconductor region and the surface of the third semiconductor layer; and a second electrode provided on a rear surface of the semiconductor substrate. The semiconductor device has a threshold voltage that is higher than forward voltage of a built-in PN diode constituted by the second semiconductor layer, the semiconductor substrate, and the first semiconductor layer.

In the embodiment, the semiconductor device further includes a trench penetrating the third semiconductor layer and reaching the first semiconductor layer. The gate electrode is provided in the trench, via the gate insulating film.

In the embodiment, an impurity concentration of the third semiconductor layer is in a range from $1\times10^{15}$ to $1\times10^{18}$/cm$^3$.

In the embodiment, a thickness of the gate insulating film is in a range from 25 nm to 200 nm.

In the embodiment, the gate electrode is made of a poly-silicon of the second conductivity type, an impurity concentration of the gate electrode being in a range from $1\times10^{20}$ to $1\times10^{22}$/cm$^3$.

According to another embodiment of the present invention, a method of manufacturing a semiconductor device, includes forming on a front surface of a semiconductor substrate of a first conductivity type, a first semiconductor layer of the first conductivity type and having an impurity concentration lower than that of the semiconductor substrate; selectively forming a second semiconductor layer of a second conductivity type in a surface layer of the first semiconductor layer on a first side of the first semiconductor layer, opposite a second side of the first semiconductor layer facing toward the semiconductor substrate; forming a third semiconductor layer of the second conductivity type on a surface layer of the second semiconductor layer on a first side of the second semiconductor layer, opposite a second side of the second semiconductor layer facing toward the semiconductor substrate, the third semiconductor layer having an impurity concentration lower than that of the second semiconductor layer; selectively forming a first semiconductor region of the first conductivity type in a surface layer of the third semiconductor layer on a first side of the third semiconductor layer, opposite a second side of the third semiconductor layer facing toward the semiconductor substrate; forming a second semiconductor region of the first conductivity type, penetrating the third semiconductor layer and reaching the first semiconductor layer; forming a gate electrode on at least a part of a surface of the third semiconductor layer sandwiched between the first semiconductor region and the second semiconductor region, the gate electrode formed via a gate insulating film; forming a first electrode on a surface of the first semiconductor region and the surface of the third semiconductor layer; and forming a second electrode on a rear surface of the semiconductor substrate. A threshold voltage of the semiconductor device is higher than forward voltage of a built-in PN diode constituted by the second semiconductor layer, the semiconductor substrate, and the first semiconductor layer.

In the embodiment, the method further includes forming a trench that penetrates the third semiconductor layer and reaches the first semiconductor layer, the trench being formed after forming the second semiconductor region and before forming the gate electrode. Forming the gate electrode includes forming the gate electrode in the trench, via the gate insulating film.

Objects, features, and advantages of the present invention are specifically set forth in or will become apparent from the following detailed description of the invention when read in conjunction with the accompanying drawings.

DESCRIPTION OF EMBODIMENTS

Figure 8:
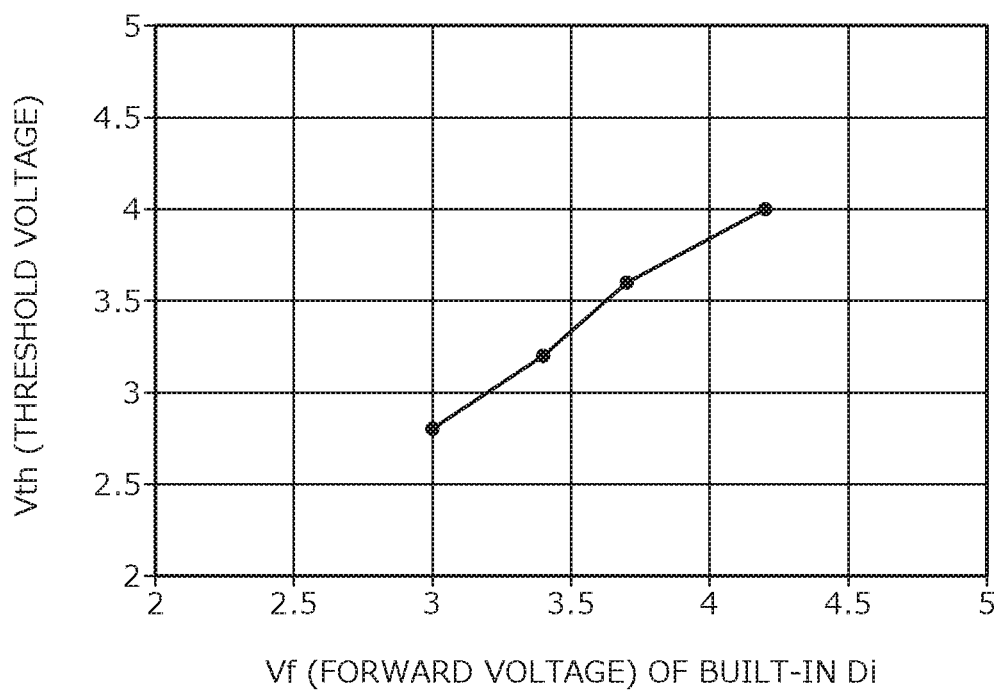
FIG. 8 is a graph depicting a relationship of forward voltage of a built-in PN diode and threshold voltage of a SiC-MOSFET.

First, problems associated with the related techniques will be discussed. FIG. 8 is a graph depicting a relationship of forward voltage of a built-in PN diode and threshold voltage of a SiC-MOSFET. A horizontal axis indicates forward voltage in units of V, while a vertical axis indicates threshold voltage in units of V. As depicted in FIG. 8, when forward voltage Vf of the built-in PN diode of the SiC-MOSFET increases, a threshold voltage Vth of the MOSFET also increases. Nonetheless, in the SiC-MOSFET, the relationship of the threshold voltage Vth of the MOSFET and the forward voltage Vf of the built-in PN diode is Vf>Vth. In general, the threshold voltage Vth is 1V to 2V and the forward voltage Vf is 3V to 5V.

In the case of silicon, the relationship of the threshold voltage Vth of the MOSFET and the forward voltage Vf of the built-in PN diode is Vf<Vth. In general, the threshold voltage Vth is 0.7V to 1.0V and the forward voltage Vf is 2V to 5V.

Figure 7:
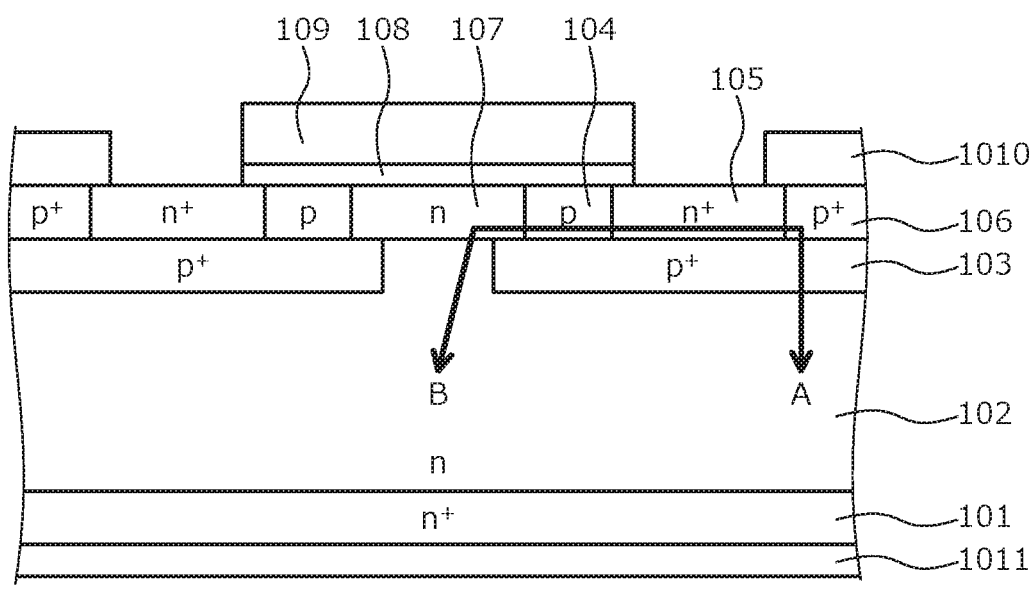
FIG. 7 is a cross-sectional view of a conventional vertical SiC-MOSFET.

When high voltage is applied to the source electrode 1010 and the built-in PN diode is driven, current flows in the built-in PN diode (e.g., A in FIG. 7). Here, in the SiC-MOSFET, since the relationship is Vf>Vth, current may flow directly beneath the gate electrode 109, to the PN junction between the p-type base layer 104 and the n-type well region 107 (e.g., B in FIG. 7). Due to this current, carriers are injected into the n$^+$-type silicon carbide substrate 101 and the n-type silicon carbide epitaxial layer 102, facilitating the flow of current. Therefore, a rate of conductivity modulation increases and crystal defects become likely to occur. Due to these crystal defects, problems arise in that ON resistance increases; and the threshold voltage Vth of the MOSFET and the forward voltage Vf of the built-in PN diode vary.

Further, in the SiC-MOSFET, even when the relationship is Vf<Vth initially, due to the current flowing in the built-in PN diode, etc., the forward voltage Vf gradually increases. Therefore, with continued use of the SiC-MOSFET, the relationship becomes Vf>Vth, and the problems above occur.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
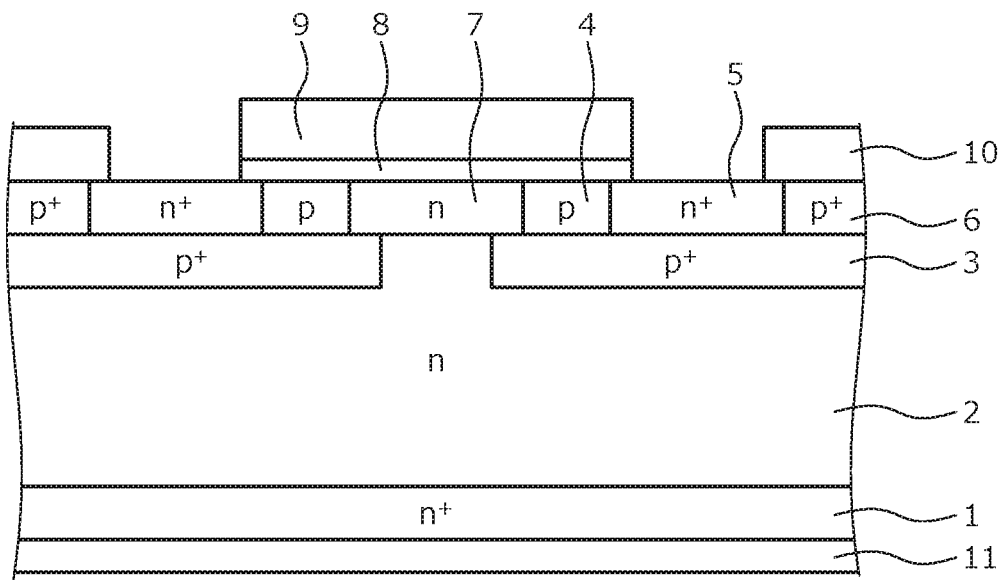
FIG. 1 is a cross-sectional view of a silicon carbide semiconductor device according to an embodiment.
Figure 2:
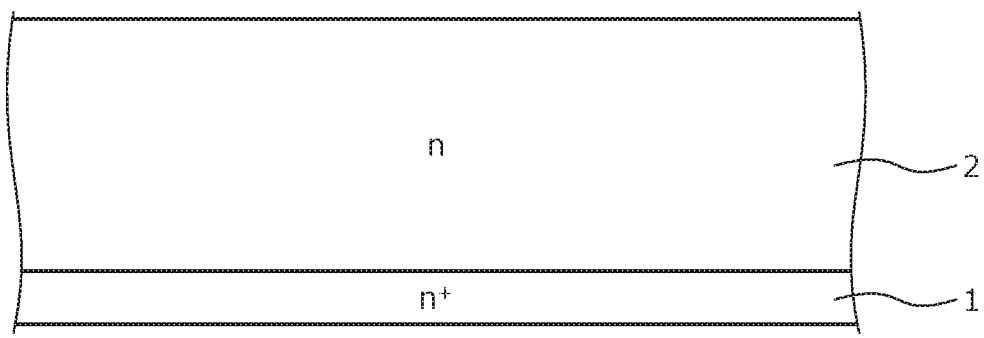
FIG. 2 is a cross-sectional view of the silicon carbide semiconductor device according to the embodiment during manufacture.
Figure 3:
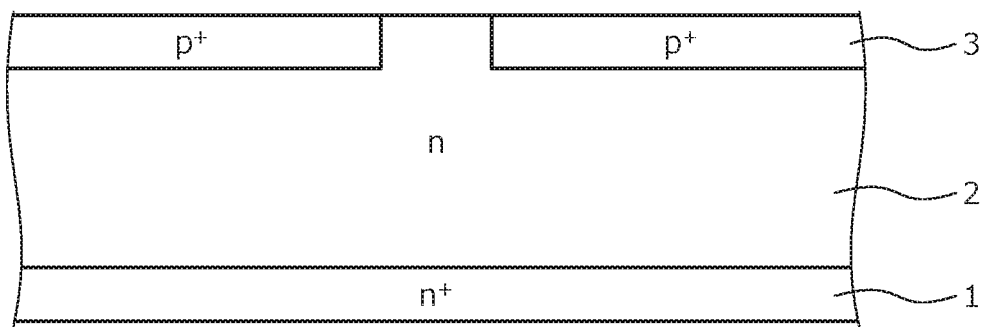
FIG. 3 is a cross-sectional view of the silicon carbide semiconductor device according to the embodiment during manufacture.
Figure 4:
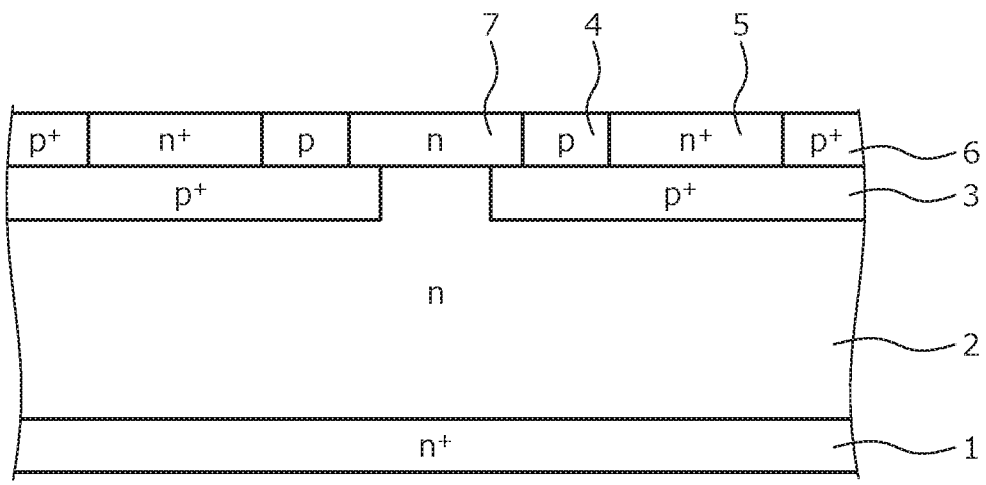
FIG. 4 is a cross-sectional view of the silicon carbide semiconductor device according to the embodiment during manufacture.
Figure 5:
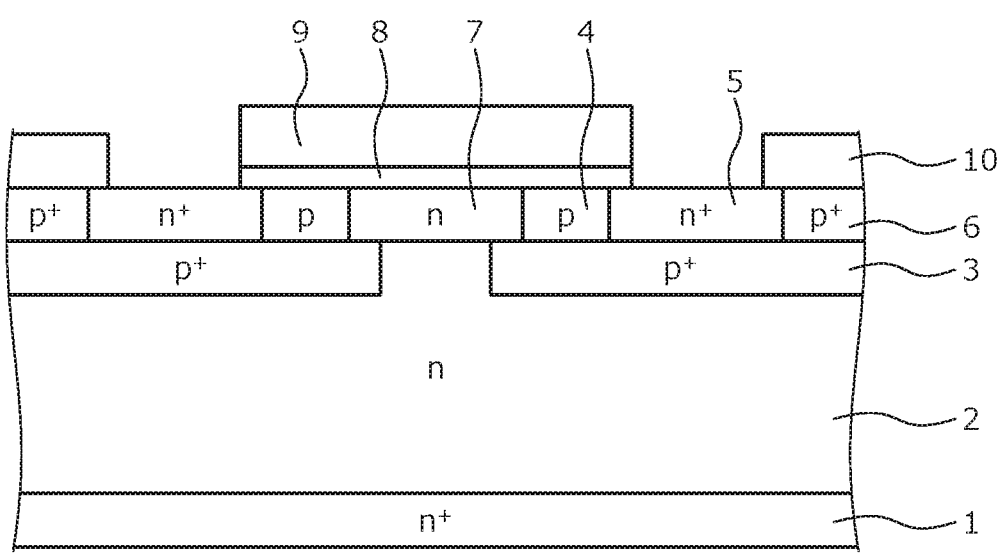
FIG. 5 is a cross-sectional view of the silicon carbide semiconductor device according to the embodiment during manufacture.

A semiconductor device according to an embodiment of the present invention is configured using a wide-bandgap semiconductor material having a bandgap wider than that of silicon. In the embodiment, a silicon carbide semiconductor device fabricated using, for example, silicon carbide (SiC) as the wide-bandgap semiconductor material will be described taking a MOSFET as an example. FIG. 1 is a cross-sectional view of the silicon carbide semiconductor device according to the embodiment.

As depicted in FIG. 1, in the silicon carbide semiconductor device according to the embodiment, on a main surface (front surface) of an n$^+$-type silicon carbide substrate (semiconductor substrate of a first conductivity type) 1, an n-type silicon carbide epitaxial layer (first semiconductor layer of the first conductivity type) 2 is deposited.

The n$^+$-type silicon carbide substrate 1 is a silicon carbide single-crystal substrate doped with, for example, nitrogen (N). The n-type silicon carbide epitaxial layer 2 is a low-concentration n-type drift layer doped with, for example, nitrogen and has an impurity concentration lower than that of the n$^+$-type silicon carbide substrate 1. Hereinafter, the n$^+$-type silicon carbide substrate 1 alone, or a combination of the n$^+$-type silicon carbide substrate 1 and the n-type silicon carbide epitaxial layer 2 is assumed as a silicon carbide semiconductor base.

As depicted in FIG. 1, in the silicon carbide semiconductor device according to the embodiment, the n$^+$-type silicon carbide substrate 1 constitutes a drain region and a drain electrode (second electrode) 11 is provided at a surface (rear surface of the silicon carbide semiconductor base) of the n$^+$-type silicon carbide substrate 1 on a first side of the n$^+$-type silicon carbide substrate 1, opposite a second side thereof facing toward the n-type silicon carbide epitaxial layer 2. Further, a drain electrode pad (not depicted) for connection with an external device is provided.

On a front surface side of the silicon carbide semiconductor base, a MOS (insulated gate constituted by a metal oxide film semiconductor) structure (element structure) is formed. In particular, in a surface layer on a first side (the front surface side of the silicon carbide semiconductor base) of the n-type silicon carbide epitaxial layer 2, opposite a second side thereof facing toward the n$^+$-type silicon carbide substrate 1, a p$^+$-type base layer (second semiconductor layer of a second conductivity type) 3 is selectively provided. The p$^+$-type base layer 3 is doped with, for example, aluminum (Al).

At a surface of the n-type silicon carbide epitaxial layer 2 sandwiched between the p$^+$-type base layer 3 and the p$^+$-type base layer 3 adjacent thereto, a p-type silicon carbide epitaxial layer (hereinafter, p-type base layer, third semiconductor layer of the second conductivity type) 4 is selectively deposited. An impurity concentration of the p-type base layer 4 is lower than an impurity concentration of the p$^+$-type base layer 3. The p-type base layer 4 is doped with, for example, aluminum.

At a surface of the p-type base layer 4 on the p$^+$-type base layer 3, an n$^+$-type source region (first semiconductor region of the first conductivity type) 5 and a p$^+$-type contact region 6 are provided. Further, the n$^+$-type source region 5 and the p$^+$-type contact region 6 are in contact with each other. The n$^+$-type source region 5 is disposed at an outer periphery of the p$^+$-type contact region 6.

Further, at a part of the p-type base layer 4 on the n-type silicon carbide epitaxial layer 2, an n-type well region (second semiconductor region of the first conductivity type) 7 that penetrates the p-type base layer 4 in a depth direction and reaches the n-type silicon carbide epitaxial layer 2 is provided. The n-type well region 7 together with the n-type silicon carbide epitaxial layer 2 constitutes a drift region. At a surface of a part of the p-type base layer 4 sandwiched between the n$^+$-type source region 5 and the n-type well region 7, a gate electrode 9 is provided, via a gate insulating film 8. The gate electrode 9 may be provided at a surface of the n-type well region 7, via the gate insulating film 8.

In FIG. 1, while only one MOS structure is depicted, plural MOS structures may be disposed in parallel.

An interlayer insulating film (not depicted) is provided on the front surface side of the silicon carbide semiconductor base overall so as to cover the gate electrode 9. A source electrode (first electrode) 10 is in contact with the n$^+$-type source region 5 and the p$^+$-type contact region 6 through a contact hole opened in the interlayer insulating film. The source electrode 10 is electrically insulated from the gate electrode 9 by the interlayer insulating film. On the source electrode 10, an electrode pad (not depicted) is provided.

Here, an impurity concentration of the p-type base layer 4 is higher than an impurity concentration of the p-type base layer 104 of the conventional SiC-MOSFET. The p-type base layer 4 is a region in which a channel is formed when the MOSFET is ON and therefore, by increasing the impurity concentration of the p-type base layer 4, the voltage necessary for forming the channel increases. Thus, in the embodiment, a threshold voltage Vth of the MOSFET increases. The threshold voltage Vth becomes higher than a forward voltage Vf of a built-in PN diode constituted by the p$^+$-type base layer 3, the n$^+$-type silicon carbide substrate 1, and the n-type silicon carbide epitaxial layer 2.

Further, the threshold voltage Vth of the MOSFET may be about 1.5 to 2 times higher than the initial forward voltage Vf of the built-in PN diode. This is to make the threshold voltage Vth higher than the forward voltage Vf, which gradually increases due to the current flowing in the built-in PN diode, etc. For example, in the SiC-MOSFET, the forward voltage Vf of the built-in PN diode is 3V to 5V and therefore, the threshold voltage Vth may be 3V to 8V. Here, to make the threshold voltage Vth of the MOSFET about 1.5 to 2 times higher than the forward voltage Vf of the built-in PN diode, the impurity concentration of the p-type base layer 4 may be set to be in a range from $1\times10^{15}$ to $1\times10^{18}/\text{cm}^3$.

Further, to increase the threshold voltage Vth of the MOSFET, a thickness of the gate insulating film 8 may be made thicker than that of the gate insulating film 108 in the conventional SiC-MOSFET. In this case, the impurity concentration of the p-type base layer 4 needs not be increased. In particular, to make the threshold voltage Vth of the MOSFET about 1.5 to 2 higher than the forward voltage Vf of the built-in PN diode, the thickness of the gate insulating film 8 may be in a range from 25 nm to 200 nm.

Further, to increase the threshold voltage Vth of the MOSFET, a thickness of the gate electrode 9 may be made thicker than that of the gate electrode 109 in the conventional SiC-MOSFET. In this case, neither the impurity concentration of the p-type base layer 4 nor the thickness of the gate insulating film 8 needs to be increased. Here, in relation to the bandgap, a dopant of the gate electrode 9 may be a p-type impurity since a p-type impurity may increase the threshold voltage Vth to a greater extent than an n-type impurity. For example, to increase the threshold voltage Vth, boron (B) or aluminum (Al) may be used as the p-type impurity. In particular, to make the threshold voltage Vth of the MOSFET about 1.5 to 2 times the forward voltage Vf of the built-in PN diode, the gate electrode 9 may be constituted by a p-type poly-silicon and may have an impurity concentration in a range from $1\times10^{20}$ to $1\times10^{22}/\text{cm}^3$.

Further, to increase the threshold voltage Vth of the MOSFET, a width of the p-type base layer 4 may be made narrower than that of the p-type base layer 104 in the conventional SiC-MOSFET, or an impurity concentration of the $n^+$-type source region 5 may be made higher than that of the $n^+$-type source region 105 in the conventional SiC-MOSFET. In these cases, the impurity concentration of the p-type base layer 4 needs not be increased, the thickness of the gate insulating film 8 needs not be increased, and the thickness of the gate electrode 9 needs not be increased.

As a technique of increasing the threshold voltage Vth of the MOSFET, the five techniques described above are available. While the threshold voltage Vth may be increased by performing the techniques independently, the threshold voltage Vth may be increased by combining the techniques. For example, the impurity concentration of the p-type base layer 4 may be increased and the thickness of the gate insulating film 8 may be increased.

A method of manufacturing the silicon carbide semiconductor device according to the embodiment will be described taking a case in which, for example, a 1200V MOSFET is fabricated. FIGS. 2, 3, 4, and 5 are cross-sectional views of the silicon carbide semiconductor device according to the embodiment during manufacture. First, for example, the $n^+$-type silicon carbide substrate 1 is prepared, doped with nitrogen and having an impurity concentration of about $2\times10^{19}/\text{cm}^3$. The $n^+$-type silicon carbide substrate 1 may have as the main surface, for example, a (000-1) plane having an off-angle of about 4 degrees in a <11-20>direction. Next, on the (000-1) plane of the $n^+$-type silicon carbide substrate 1, the n-type silicon carbide epitaxial layer 2 is grown doped with nitrogen to have an impurity concentration of $1.0\times10^{16}/\text{cm}^3$ and a thickness of about 10 μm. Here, the structure is that depicted in FIG. 2.

Next, by photolithography and etching, an oxide film mask for ion implantation is formed and the $p^+$-type base layer 3 is selectively formed in the surface layer of the n-type silicon carbide epitaxial layer 2 by ion implantation. In the ion implantation, for example, the dopant is aluminum and a dose amount may be set so that the impurity concentration of the $p^+$-type base layer 3 becomes $1.0\times10^{18}/\text{cm}^3$. Here, the structure is that depicted in FIG. 3.

Next, on the surface of the n-type silicon carbide epitaxial layer 2, a p-type silicon carbide epitaxial layer constituting the p-type base layer 4 is grown to a thickness of, for example, 0.5 μm. Here, for example, to make the threshold voltage Vth of the MOSFET higher than the forward voltage Vf of the built-in PN diode, the p-type silicon carbide epitaxial layer may be grown doped with aluminum so that the impurity concentration of the p-type base layer 4 is in a range from $1\times10^{15}$ to $1\times10^{18}/\text{cm}^3$.

Next, by photolithography and ion implantation, a conductivity type of a part of the p-type base layer 4 on the n-type silicon carbide epitaxial layer 2 is inverted, selectively forming the n-type well region 7. Nitrogen ions may be ion implanted so that the impurity concentration of the n-type well region 7 becomes $5.0\times10^{18}/\text{cm}^3$.

Next, by photolithography and ion implantation, in the surface layer of the p-type base layer 4 on the $p^+$-type base layer 3, the $n^+$-type source region 5 is selectively formed. Next, by photolithography and ion implantation, in the surface layer of the p-type base layer 4 on the $p^+$-type base layer 3, the $p^+$-type contact region 6 is selectively formed. Here, the structure is that depicted in FIG. 4.

Heat treatment (annealing) for activating the $p^+$-type base layer 3, the $n^+$-type source region 5, the $p^+$-type contact region 6, and the n-type well region 7 is performed. A temperature and period of the heat treatment may be 1620 degrees C. and 10 minutes, respectively.

The sequence in which the $p^+$-type base layer 3, the $n^+$-type source region 5, the $p^+$-type contact region 6, and the n-type well region 7 are formed may be variously changed.

Next, the front surface side of the silicon carbide semiconductor base is subject to thermal oxidation, thereby forming the gate insulating film 8. At this time, for example, to make the threshold voltage Vth of the MOSFET higher than the forward voltage Vf of the built-in PN diode, the thickness of the gate insulating film 8 may be in a range from 25 nm to 200 nm. The thermal oxidation may be performed by heat treatment in a mixed atmosphere of oxygen ($O_2$) and hydrogen ($H_2$), at a temperature of about 1000 degrees C. As a result, regions formed at the surfaces of the p-type base layer 4 and the n-type silicon carbide epitaxial layer 2 are covered by the gate insulating film 8.

Next, on the gate insulating film 8, a polycrystalline silicon layer (poly-silicon (poly-Si) layer) doped with, for example, phosphorus (P) is formed as the gate electrode 9. Next, the polycrystalline silicon layer is patterned and selectively removed, leaving the polycrystalline silicon layer on a part of the p-type base layer 4 sandwiched between the $n^+$-type source region 5 and the n-type well region 7. At this time, the polycrystalline silicon layer may be left on the n-type well region 7.

Next, for example, a phosphate glass such as a phosphosilicate glass (PSG) is deposited as the interlayer insulating film so as to cover the gate insulating film 8. A thickness of the interlayer insulating film may be 1.0 μm. Next, the interlayer insulating film and the gate insulating film 8 are patterned and selectively removed, forming a contact hole and thereby, exposing the $n^+$-type source region 5 and the $p^+$-type contact region 6. Next, heat treatment (reflow) for planarizing the interlayer insulating film is performed.

Next, on a surface of the interlayer insulating film, the source electrode 10 is deposited. At this time, the source electrode 10 is also embedded in the contact hole, whereby the n+-type source region 5, the p+-type contact region 6 and the source electrode 10 are in contact with each other. Next, the source electrode 10 excluding that in the contact hole is selectively removed. Here, the structure is that depicted in FIG. 5.

Next, on the first surface (rear surface of the silicon carbide semiconductor base) of the n+-type silicon carbide substrate 1, for example, a nickel film is deposited as the drain electrode 11. Subsequently, for example, heat treatment at a temperature of 970 degrees C. is performed, forming an ohmic junction between the n+-type silicon carbide substrate 1 and the drain electrode 11. Next, for example, by a sputtering method, the electrode pad is deposited on the front surface of the silicon carbide semiconductor base overall so as to cover the source electrode 10 and the interlayer insulating film. A thickness of a part of the electrode pad on the interlayer insulating film may be, for example, 5 µm. The electrode pad may be formed by, for example, aluminum that contains silicon at a rate of 1% (Al—Si). Next, the electrode pad is selectively removed.

Next, on a surface of the drain electrode 11, for example, titanium (Ti), nickel (Ni), and gold (Au) are sequentially deposited as the drain electrode pad. Next, a protective film may be formed on a surface. Thus, the MOSFET depicted in FIG. 1 is completed.

Figure 6:
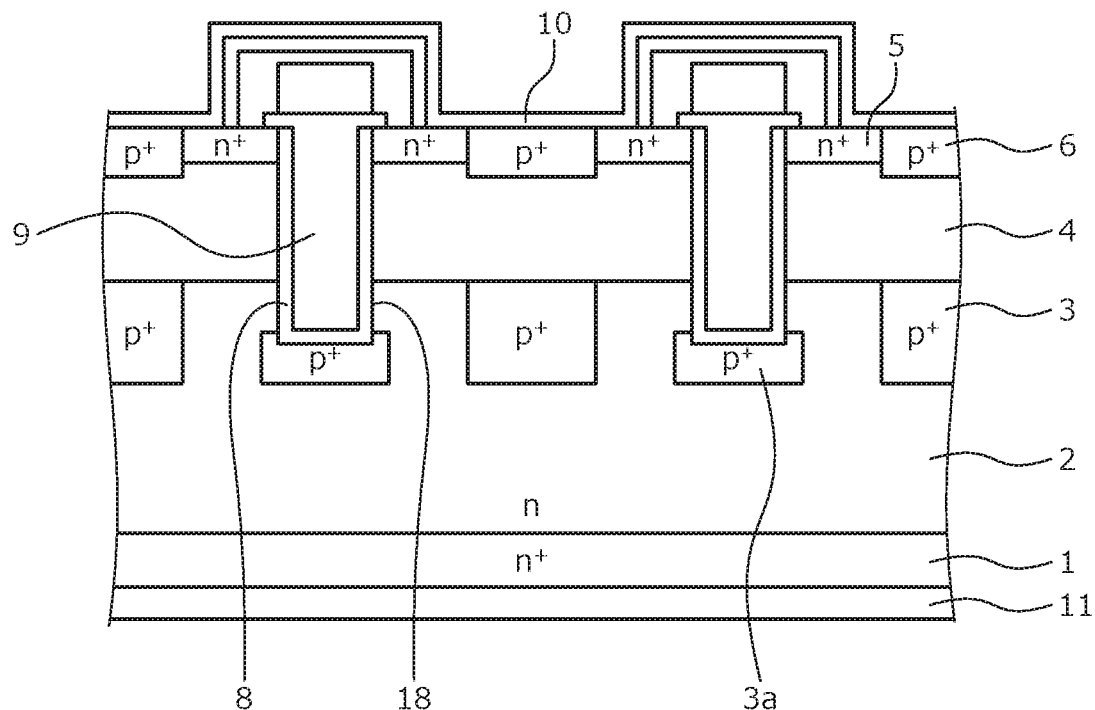
FIG. 6 is a cross-sectional view of another structure of the silicon carbide semiconductor device according to the embodiment.

FIG. 6 is a cross-sectional view of another structure of the silicon carbide semiconductor device according to the embodiment. FIG. 6 depicts a vertical MOSFET having a trench structure. In the vertical MOSFET, compared to a planar structure in which the channel is formed parallel to a substrate surface, cell density per unit area may be increased by the trench structure in which the channel is formed orthogonal to the substrate surface, enabling current density per unit area to be increased, which is advantageous from an aspect of cost.

In FIG. 6, the trench structure is formed at a first main surface side (side with the p-type base layer 4) of the silicon carbide semiconductor base. In particular, a trench 18 penetrates the p-type base layer 4 from a surface of the p-type base layer 4 on a first side (the first main surface side of the silicon carbide semiconductor base) of the p-type base layer 4, opposite a second side of the p-type base layer 4 facing toward the n+-type silicon carbide substrate 1, and the trench 18 reaches the n-type silicon carbide epitaxial layer 2. Along an inner wall of the trench 18, the gate insulating film 8 is formed on side walls and a bottom of the trench 18. The gate electrode 9 is formed on the gate insulating film 8 in the trench 18. The gate electrode 9 is insulated from the n-type silicon carbide epitaxial layer 2 and the p-type base layer 4 by the gate insulating film 8. A part of the gate electrode 9 may protrude from a top (side where a source electrode pad is provided) of the trench 18, toward the source electrode pad.

At a surface of the n-type silicon carbide epitaxial layer 2 on the first side (the first main surface side of the silicon carbide semiconductor base) of the n-type silicon carbide epitaxial layer 2, opposite the second side the n-type silicon carbide epitaxial layer 2 facing toward the n+-type silicon carbide substrate 1, the p+-type base layer (third semiconductor region of the second conductivity type) 3 is selectively provided. The p+-type base layer 3 reaches a position deeper toward a drain than is the bottom of the trench 18. A lower end (end facing toward the drain) of the p+-type base layer 3 is positioned closer to the drain than is the bottom of the trench 18.

Further, in the n-type silicon carbide epitaxial layer 2, a second p+-type region 3a is selectively provided. The second p+-type region 3a is provided so as to be in contact with the bottom of the trench 18. The second p+-type region 3a is provided from a position deeper toward the drain than is an interface of the p-type base layer 4 and the n-type silicon carbide epitaxial layer 2, to a depth reaching an interface of the n+-type silicon carbide substrate 1 and the n-type silicon carbide epitaxial layer 2.

Other structures of the MOSFET depicted in FIG. 6 are similar to those of the MOSFET depicted in FIG. 1 and therefore, description thereof is omitted hereinafter. Further, with the exception of processes of forming the trench 18, the gate insulating film 8 and the gate electrode 9, a method of manufacturing the MOSFET depicted in FIG. 6 is similar to the method of manufacturing the MOSFET depicted in FIG. 1 and therefore, detailed description thereof is omitted hereinafter. Formation of the trench 18, the gate insulating film 8 and the gate electrode 9, for example, is performed as follows.

First, on the surface of the p-type base layer 4 (i.e., surfaces of the n+-type source region 5 and the p+-type contact region 6), a non-depicted mask having predetermined openings formed by a photolithographic technique is formed using, for example, an oxide film. Subsequently, using the oxide film as a mask, the trench 18 is formed by dry etching or the like to penetrate the n+-type source region 5 and the p-type base layer 4, and reach the n-type silicon carbide epitaxial layer 2.

Next, the gate insulating film 8 is formed along the surfaces of the n+-type source region 5 and the p+-type contact region 6, and the bottom and the side walls of the trench 18. The gate insulating film 8 may be formed by thermal oxidation by heat treatment at a temperature of about 1000 degrees C. in an oxygen atmosphere. Further, the gate insulating film 8 may be formed by a deposition method by a chemical reaction such as that for a high temperature oxide (HTO).

Next, on the gate insulating film 8, for example, a polycrystalline silicon layer doped with phosphorus atoms is formed. The polycrystalline silicon layer may be formed so as to be embedded in the trench 18. The polycrystalline silicon layer is patterned and left in the trench 18, thereby forming the gate electrode 9.

In the MOSFET depicted in FIG. 6, similarly to the MOSFET depicted in FIG. 1, by increasing the impurity concentration of the p-type base layer 4, by increasing the thickness of the gate insulating film 8, by increasing the thickness of the gate electrode 9, by reducing the width of the p-type base layer 4, or by increasing the impurity concentration of the n+-type source region 5, the threshold voltage Vth of the MOSFET may be made higher than the forward voltage Vf of the built-in PN diode. Further, in the MOSFET depicted in FIG. 6, these techniques may be combined.

As described, according to the semiconductor device of the embodiment, the impurity concentration of the p-type base layer is increased, etc., whereby the threshold voltage Vth of the MOSFET is increased and is increased to be greater than the forward voltage Vf of the built-in PN diode. As a result, even when high electric potential is applied to the source electrode and the built-in PN diode is driven, no current flows through the PN junction between the p-type base layer and the n-type well region directly beneath the gate electrode, enabling the generation of crystal defects in the n+-type silicon carbide substrate and the n-type silicon carbide epitaxial layer to be suppressed. Therefore, without increases of ON resistance of the semiconductor device due to crystal defects, variation of the threshold voltage Vth of the MOSFET and of the forward voltage Vf of the built-in PN diode may be suppressed, enabling reliability of the semiconductor device to be maintained.

In the embodiments of the present invention, various modifications within a range not departing from the spirit of the invention are possible. For example, dimensions, impurity concentrations, etc. of regions may be variously set according to required specifications. Further, in the embodiments, while a MOSFET has been described as an example, without limitation hereto, wide application to various types of silicon carbide semiconductor devices that conduct and block current by gate driving control based on a predetermined gate threshold voltage is possible. For example, use of a semiconductor substrate of a conductivity type difference from that of the MOSFET enables application to an IGBT. Further, in the described embodiments, while a case in which silicon carbide is used as the wide-bandgap semiconductor material is described, a wide-bandgap semiconductor material other than silicon carbide such as, for example, gallium nitride (GaN) is applicable. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the embodiments of the present invention, the impurity concentration of the p-type base layer (third semiconductor layer of the second conductivity type) is increased, whereby the threshold voltage Vth of the MOSFET increases and is increased to be higher than the forward voltage Vf of the built-in PN diode. As a result, even when high electric potential is applied to the source electrode (first electrode) and the built-in PN diode is driven, no current flows through the PN junction between the p-type base layer and the n-type well region (second semiconductor region of the first conductivity type) directly beneath the gate electrode, enabling the generation of crystal defects in the $n^+$-type silicon carbide substrate (semiconductor substrate of the first conductivity type) and the n-type silicon carbide epitaxial layer (first semiconductor layer of the first conductivity type) to be suppressed. Therefore, without increases of ON resistance of the semiconductor device due to crystal defects, variation of the threshold voltage Vth of the MOSFET and of the forward voltage Vf of the built-in PN diode may be suppressed, enabling reliability of the semiconductor device to be maintained.

The semiconductor device and the method of manufacturing a semiconductor device according to the embodiments of the present invention achieve an effect in that when high electric potential is applied to the source electrode and the built-in PN diode is driven, the generation of crystal defects may be suppressed.

As described, the semiconductor device and the method of manufacturing a semiconductor device according to the embodiments of the present invention are useful for high-voltage semiconductor devices used in power converting equipment and in power supply devices such as those used in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate of a first conductivity type;
a first semiconductor layer of the first conductivity type, provided on a front surface of the semiconductor substrate, the first semiconductor layer having an impurity concentration lower than that of the semiconductor substrate;
a second semiconductor layer of a second conductivity type, selectively provided in a surface layer of the first semiconductor layer on a first side of the first semiconductor layer, opposite a second side of the first semiconductor layer facing toward the semiconductor substrate;
a third semiconductor layer of the second conductivity type, provided on the surface layer of the first semiconductor layer and on a surface layer of the second semiconductor layer on a first side of the second semiconductor layer, opposite a second side of the second semiconductor layer facing toward the semiconductor substrate, the third semiconductor layer having an impurity concentration lower than that of the second semiconductor layer;
a first semiconductor region of the first conductivity type, selectively provided in a surface layer of the third semiconductor layer on a first side of the third semiconductor layer, opposite a second side of the third semiconductor layer facing toward the semiconductor substrate;
a second semiconductor region of the first conductivity type, penetrating the third semiconductor layer and reaching the first semiconductor layer;
a gate electrode provided on at least a part of a surface of the third semiconductor layer sandwiched between the first semiconductor region and the second semiconductor region, the gate electrode provided via a gate insulating film;
a first electrode provided on a surface of the first semiconductor region and the surface of the third semiconductor layer; and
a second electrode provided on a rear surface of the semiconductor substrate, wherein
the semiconductor device is configured to have a threshold voltage that is higher than a forward voltage of a built-in PN diode constituted by the second semiconductor layer, the semiconductor substrate, and the first semiconductor layer, by configuring the third semiconductor layer to have an impurity concentration in a range from $1\times10^{15}$ to $1\times10^{18}/cm^3$, and
the threshold voltage of the semiconductor device is 1.5 to 2 times higher than the forward voltage of the built-in PN diode.

2. A semiconductor device, comprising:
a semiconductor substrate of a first conductivity type;
a first semiconductor layer of the first conductivity type, provided on a front surface of the semiconductor substrate, the first semiconductor layer having an impurity concentration lower than that of the semiconductor substrate;
a second semiconductor layer of a second conductivity type, selectively provided in a surface layer of the first semiconductor layer on a first side of the first semiconductor layer, opposite a second side of the first semiconductor layer facing toward the semiconductor substrate;
a third semiconductor layer of the second conductivity type, provided on the surface layer of the first semiconductor layer and on a surface layer of the second semiconductor layer on a first side of the second semiconductor layer, opposite a second side of the second semiconductor layer facing toward the semiconductor substrate, the third semiconductor layer having an impurity concentration lower than that of the second semiconductor layer;

a first semiconductor region of the first conductivity type, selectively provided in a surface layer of the third semiconductor layer on a first side of the third semiconductor layer, opposite a second side of the third semiconductor layer facing toward the semiconductor substrate;

a trench penetrating the third semiconductor layer and reaching the first semiconductor layer;

a gate electrode provided in the trench, via a gate insulating film a first electrode provided on a surface of the first semiconductor region and the surface of the third semiconductor layer; and a second electrode provided on a rear surface of the semiconductor substrate, wherein the semiconductor device is configured to have a threshold voltage that is higher than a forward voltage of a built-in PN diode constituted by the second semiconductor layer, the semiconductor substrate, and the first semiconductor layer, by configuring the third semiconductor layer to have an impurity concentration in a range from $1\times10^{15}$ to $1\times10^{18}/cm^3$, and the threshold voltage of the semiconductor device is 1.5 to 2 times higher than the forward voltage of the built-in PN diode.

3. The semiconductor device according to claim 1, wherein the semiconductor device is configured to have the threshold voltage that is higher than the forward voltage of the built-in PN diode, by configuring the gate insulating film to have a thickness in a range from 25 nm to 200 nm.

4. The semiconductor device according to claim 1, wherein the semiconductor device is configured to have the threshold voltage that is higher than the forward voltage of the built-in PN diode, by configuring the gate electrode to be made of a poly-silicon of the second conductivity type, and having an impurity concentration in a range from $1\times10^{20}$ to $1\times10^{22}/cm^3$.

5. The semiconductor device according to claim 2, further comprising:

a plurality of trenches penetrating the third semiconductor layer and reaching the first semiconductor layer; and a second semiconductor region of the second conductivity type provided in contact with a bottom of each of the plurality of trenches, wherein the third semiconductor layer extends between adjacent trenches among the plurality of trenches.

6. The semiconductor device according to claim 2, further comprising:

a second semiconductor region of the second conductivity type selectively provided in the surface layer of the third semiconductor layer, the second semiconductor region extending to a position deeper toward a drain than is an interface of the first semiconductor region and the third semiconductor layer.

7. A semiconductor device, comprising:

a semiconductor substrate of a first conductivity type;

a first semiconductor layer of the first conductivity type, provided on a front surface of the semiconductor substrate, the first semiconductor layer having an impurity concentration lower than that of the semiconductor substrate;

a second semiconductor layer of a second conductivity type, selectively provided in a surface layer of the first semiconductor layer on a first side of the first semiconductor layer, opposite a second side of the first semiconductor layer facing toward the semiconductor substrate;

a third semiconductor layer of the second conductivity type, provided on the surface layer of the first semiconductor layer and on a surface layer of the second semiconductor layer on a first side of the second semiconductor layer, opposite a second side of the second semiconductor layer facing toward the semiconductor substrate, the third semiconductor layer having an impurity concentration lower than that of the second semiconductor layer;

a first semiconductor region of the first conductivity type, selectively provided in a surface layer of the third semiconductor layer on a first side of the third semiconductor layer, opposite a second side of the third semiconductor layer facing toward the semiconductor substrate;

a second semiconductor region of the first conductivity type, penetrating the third semiconductor layer and reaching the first semiconductor layer;

a gate electrode provided on at least a part of a surface of the third semiconductor layer sandwiched between the first semiconductor region and the second semiconductor region, the gate electrode provided via a gate insulating film;

a first electrode provided on a surface of the first semiconductor region and the surface of the third semiconductor layer; and a second electrode provided on a rear surface of the semiconductor substrate, wherein the semiconductor device is configured to have a threshold voltage that is higher than a forward voltage of a built-in PN diode constituted by the second semiconductor layer, the semiconductor substrate, and the first semiconductor layer, by configuring the third semiconductor layer to have an impurity concentration in a range from $1\times10^{15}$ to $1\times10^{18}/cm^3$ and/or by configuring the gate insulating film to have a thickness in a range from 25 nm to 200 nm and/or by configuring the gate electrode to be made of a poly-silicon of the second conductivity type, and having an impurity concentration of in a range from $1\times10^{20}$ to $1\times10^{22}/cm^3$.

* * * * *